United States Patent [19]
Lin

[11] Patent Number: 6,016,264
[45] Date of Patent: Jan. 18, 2000

[54] ANTIFUSE PROGRAMMING AND DETECTING CIRCUIT

[75] Inventor: Ming-Zen Lin, Hsinchu, Taiwan

[73] Assignee: Vanguard International Semiconductor Corporation, Taiwan

[21] Appl. No.: 09/085,332

[22] Filed: May 26, 1998

[51] Int. Cl.$^7$ .............................. G11C 17/00; G11C 7/00
[52] U.S. Cl. .......................................... 365/96; 365/225.7
[58] Field of Search .................................... 365/96, 225.7

[56] References Cited

U.S. PATENT DOCUMENTS

| | | | |
|---|---|---|---|
| 5,148,391 | 9/1992 | Zagar ......................................... | 365/96 |
| 5,631,862 | 5/1997 | Cutter et al. ............................. | 365/96 |
| 5,680,360 | 10/1997 | Pilling et al. ......................... | 365/225.7 |
| 5,706,238 | 1/1998 | Cutter et al. ......................... | 365/225.7 |

*Primary Examiner*—David Nelms
*Assistant Examiner*—Anh Phung
*Attorney, Agent, or Firm*—Christensen, O'Connor, Johnson & Kindness PLLC

[57] ABSTRACT

An antifuse programming and detecting circuit has an antifuse which is capable of being programmed to an open state or to a short state. The circuit includes a latch circuit coupled with a power supply; a programming circuit for setting the antifuse state; and a reset circuit for resetting the output signal. The latch circuit provides and latches an output signal by detecting an antifuse state. Therefore, the state of the antifuse can be programmed, identified, and latched by the circuit design in the invention. The programming and detecting operations of the circuit provides programming, current limiting, detecting, and latching functions with simplified design and reduced number of devices.

15 Claims, 1 Drawing Sheet

ANTIFUSE PROGRAMMING AND DETECTING CIRCUIT

TECHNICAL FIELD OF THE INVENTION

The present invention relates to an antifuse programming and detecting circuit for integrated circuits.

BACKGROUND OF THE INVENTION

An integrated circuit chip may contain millions of devices. With such a high packing density, the yield control of the fabrication process is of vital importance. Any defects or damage in the devices on a chip may cause the chip to fail quality inspection. Thus, the yield is greatly reduced with unavoidable defects in densely packed integrated circuits.

One prior art approach to this problem is to form additional spare devices on the chip to replace defective devices. This technique greatly improves the yield of the products and is now widely applied in various applications. One of the major applications is in the fabrication of memory arrays. In the design of memory devices, several redundant rows and columns of memory cells are added to a regular memory array. After the manufacturing processes are finished, a chip probe test is performed to test the function of the devices. The defective devices can be identified and replaced with spare devices by modifying the conductive paths on the chip.

In conventional chip design, a fuse structure is used in rewiring the conductive path to make replacement devices. A fuse bank containing a plurality of fuses are formed on the chip. When a defective memory cell is identified, the fuse addressing the cell is broken and the operating current of the defective device is directed to a defect-free memory cell in the spare rows or columns. Thus, chip defects caused by defective cells can be repaired by identifying and selectively breaking fuses. As an example, if two rows and two columns of redundant cells are used for each memory cell array, the maximum number of defective cells which can be replaced is four.

A widely employed technique in breaking the fuse is to blow the specified fuse by laser energy through a fuse window. However, the use of a laser in blowing the fuses is a time-consuming job with some reliability problems. The identified defective cells must be replaced by applying a laser on each corresponding addressed fuse. The laser beam must be accurately aligned to a correct fuse. The process in blowing the fuses one-by-one is quite time-consuming. Additionally, the energy applied must be well controlled to open the fuse path entirely without forming a residue.

An antifuse technology is proposed as an alternative way to the fuse structure. A programmable antifuse is employed. By programming a fuse to be open or be shorted electrically, the state of each fuse can be changed and the defective cells can be replaced with redundant ones. The same function as the fuse structure can be achieved by detecting the state of each addressed fuse to determine the current path.

The antifuse technology provides a more efficient and reliable way by programming the antifuse electrically versus blowing the fuse physically with a laser. However, the prior art antifuse circuit design requires a complex circuit in programming and detecting the fuse state. An improved antifuse circuit is highly desired for providing the programming and detecting function with device and area saving characteristics.

SUMMARY OF THE INVENTION

In accordance with the present invention, a proposed antifuse programming and detecting circuit includes an antifuse being programmable at an open state or a short state, a latch circuit coupled with a power supply, a programming circuit, and a reset circuit. The latch circuit provides and latches an output signal by detecting the state of the antifuse. The programming circuit is applied for setting the state of the antifuse, and the reset circuit is applied for resetting the output signal from the latch circuit.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

Figure 1:
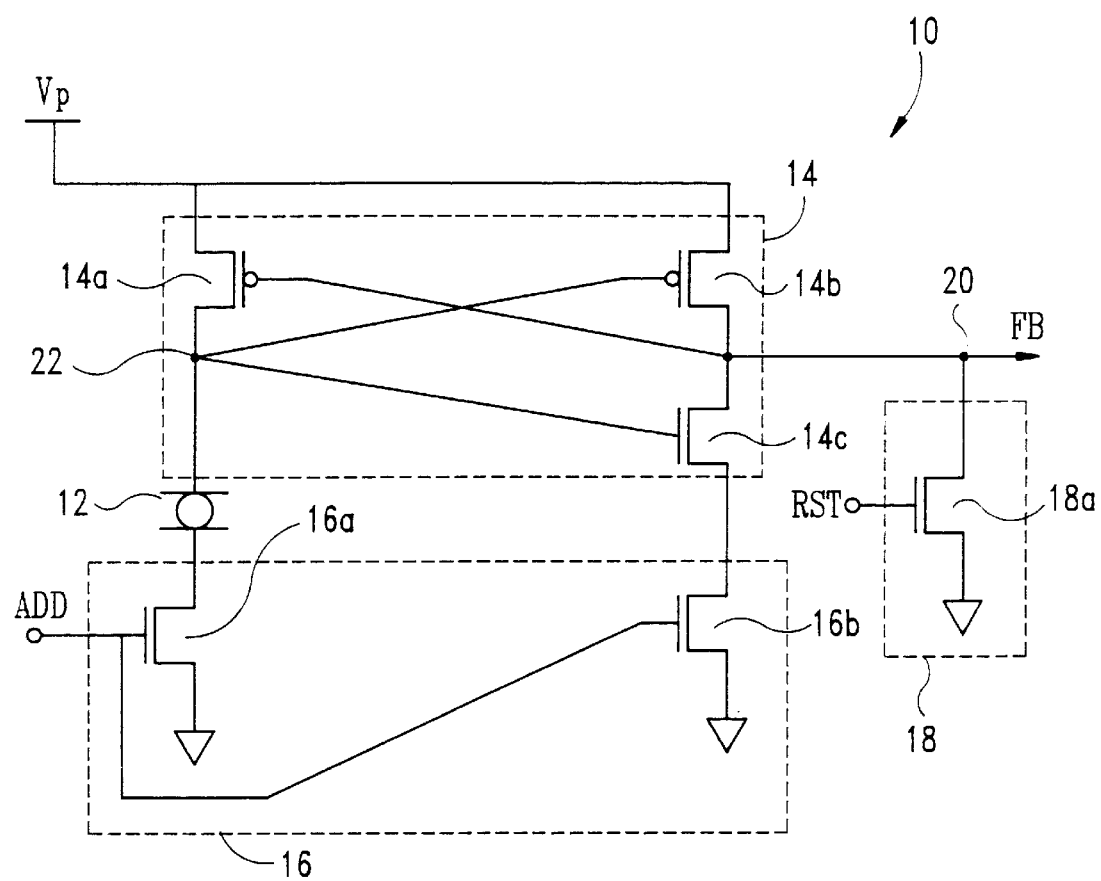
FIG. 1 illustrates an antifuse programming and detecting circuit in accordance with the present invention.

The present invention discloses an antifuse programming and detecting circuit for integrated circuits. The antifuse programming and detecting circuit is implemented with fewer devices and the area required is minimized with the simplified design.

Turning to FIG. 1, the antifuse programming and detecting circuit 10 in accordance with the present invention is illustrated. The antifuse programming and detecting circuit 10 includes an antifuse 12, a latch circuit 14, a programming circuit 16, and a reset circuit 18.

The antifuse 12 is a programmable device which can be programmed to be in an open state or a short state. In general, the antifuse 12 is normally at an open state. In this case, a capacitive device is employed. The capacitive device can be two conductive structures with a dielectric therebetween. When a threshold voltage is applied to the capacitive device, the dielectric between the two conductive structures is broken down and the antifuse 12 is programmed to the short state. For the capacitive device used in the case, once the antifuse 12 is programmed to the short state, it maintains at the short state forever.

The latch circuit 14 is coupled with a power supply Vp and provides an output signal FB. The output signal FB is provided by detecting the state of the antifuse 12. The detected state is latched in the latch circuit 14 as long as the supply power Vp is maintained. The power supply Vp can be a voltage source which provides the programming and operating voltage of the antifuse programming and detecting circuit 10. The latch circuit can be implemented by a first transistor 14a, a second transistor 14b, and a third transistor 14c. The first transistor 14a and the second transistor 14b are cross-coupled with sources coupled to the power supply Vp and with gates cross-coupled to drains, as indicated in FIG. 1. The drain of the first transistor 14a is also coupled to the antifuse 12. The third transistor 14c has its two terminals coupled between the drain of the second transistor 14b and a ground connection. The ground connection of the third transistor 14c is provided through a controlling transistor 16b in the programming circuit 16. The gate of the third transistor 14c is coupled to the drain of the first transistor 14a.

The programming circuit 16 is used for breaking the antifuse 12. In this case, the programming circuit 16 has a first transistor 16a with its two terminals coupled between the antifuse 12 and a ground connection. The gate of the first transistor 16a is responsive to an addressing signal ADD to address the breaking of the fuse 12 in the programming process. The programming circuit 16 further includes a second transistor 16b with the gate responsive to the addressing signal ADD to control the ground connection to the latch circuit 14.

The reset circuit 18 is coupled at the output signal node for resetting the output signal FB. In general, the reset circuit 18 can be a transistor 18a with its two terminals coupled between a node 20 of the output signal FB and a ground connection, and with the gate being responsive with a reset signal RST. Once the reset signal RST is high, the output signal FB is reset by connecting the node 20 to ground by the turning-on of the transistor 18a.

The programming and detecting operations of the circuit 10 is as follows. At first, the output signal FB is reset to ground by the reset circuit 18. A programming voltage is supplied to the power source Vp. In this case, a 5 V programming voltage is used. The gate of the transistor 14a is low and the transistor 14a is turned on. The state at node 22 is high and the transistor 14b is turned off to keep the node 20 at low. If the antifuse 12 is specified to set at the unchanged open state, the ADD input is low and the open state of the antifuse 12 remains unchanged.

A high state can be input as ADD to address the antifuse 12, for example, to achieve the replacement of a defective cell. The transistor 16a is turned on to connect one end of the antifuse 12 to ground. The voltage across the antifuse 12 becomes about the programming voltage of nearly 5 V, and the antifuse 12 is broken-down to be the short state.

Once the antifuse 12 is short, the latch circuit 14 serves as a current limiting circuit. The node 22 becomes low once the antifuse 12 is shorted to ground. The transistor 14b is then turned on and the voltage of the node 20 turns to high. The transistor 14a is turned off. Thus, the short of the antifuse 12 won't draw the programming voltage to ground and pass a current. The current is limited by turning off the transistor 14a and the programming voltage can be maintained at a constant value.

The current limiting function is important when several antifuses in a antifuse bank are programmed at the same time. By limiting the current through the antifuse at the short state, the programming voltage can be maintained at a constant high to ensure the programming of other slower or later breaking antifuses.

After the antifuse 12 is programmed, the latch circuit 14 is used to detect and latch the detected state of the antifuse 12 to provide the output signal FB. By identifying the output signal FB, the current path of the integrated circuit is determined. Therefore, defect-free redundant cells can be arranged to replace defective ones.

During the detecting process, an operational voltage, such as 3.3 V, is provided to the power supply Vp. The addressing signal ADD is kept at high and the transistor 16a and 16b are turned on to provide the latch circuit 14 with the ground connection. The output signal FB is initialized at low by the reset circuit 18. The transistor 14a is turned on and the node 22 is high. If the antifuse 12 is at the open state, the node 22 remains high to turn off the transistor 14b and to turn on the transistor 14c. The output signal FB remains low and is latched at that state. However, if the antifuse 12 is at the short state to connect node 22 to ground, the node 22 is then pulled to low to turn on the transistor 14b and to turn off the transistor 14c. The output signal FB is then pulled high and latched at that state. Therefore, the state of the antifuse 12 can be identified and latched by the circuit design in the invention. The programming and detecting operations of the circuit 10 provides programming, current limiting, detecting, and latching functions with simplified design and reduced number of devices.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded the broadest interpretation so as to encompass all such modifications and similar structures.

What is claimed is:

1. An antifuse programming and detecting circuit comprising:

an antifuse being programmable at an open state or a short state;

a latch circuit coupled with a power supply, said latch circuit providing and latching an output signal by detecting an antifuse state, said latch circuit comprising a first transistor, a second transistor, and a third transistor, said first transistor and said second transistor being cross-coupled with sources coupled to said power supply and with gates cross-coupled to drains, said drain of said first transistor being coupled to said antifuse, said third transistor having two terminals coupled between said drain of said second transistor and a ground connection, and having a gate coupled to said drain of said first transistor;

a programming circuit for setting said antifuse state; and a reset circuit for resetting said output signal.

2. The antifuse programming and detecting circuit of claim 1, wherein said antifuse is a capacitive element.

3. The apparatus of claim 1, wherein said latch circuit serves as a current limiting circuit when said programming circuit sets said antifuse at said short state.

4. The antifuse programming and detecting circuit of claim 2, wherein said capacitive element can be broken down to set said short state.

5. The antifuse programming and detecting circuit of claim 1, wherein said power supply is a voltage source.

6. The antifuse programming and detecting circuit of claim 1, wherein said programming circuit comprises a first transistor with two terminals coupled between said antifuse and a ground connection, and with its gate coupled to an addressing signal.

7. The antifuse programming and detecting circuit of claim 1, wherein said programming circuit further comprises a second transistor with a gate coupled to said addressing signal for controlling said ground connection to said latch circuit.

8. The antifuse programming and detecting circuit of claim 1, wherein said reset circuit comprises a transistor with two terminals coupled between a node of said output signal and a ground connection, and with a gate being coupled to a reset signal.

9. An antifuse programming and detecting circuit comprising:

an antifuse being programmable at an open state or a short state;

a latch circuit coupled with a power supply, said latch circuit providing and latching an output signal by detecting an antifuse state, said latch circuit comprising a first transistor, a second transistor, and a third transistor, said first transistor and said second transistor being cross-coupled with sources coupled to said power supply and with gates cross-coupled to drains, said drain of said first transistor being coupled to said antifuse, said third transistor having two terminals coupled between said drain of said second transistor and a ground connection, and having a gate coupled to said drain of said first transistor;

a programming circuit for setting said antifuse state; and a reset circuit for resetting said output signal.

10. The antifuse programming and detecting circuit of claim 9, wherein said antifuse is a capacitive element which can be broken down to set said short state.

11. The antifuse programming and detecting circuit of claim 9, wherein said latch circuit serves as a current limiting circuit when said programming circuit sets said antifuse at said short state.

12. The antifuse programming and detecting circuit of claim 9, wherein said power supply is a voltage source.

13. The antifuse programming and detecting circuit of claim 9, wherein said programming circuit comprises a first transistor with two terminals coupled between said antifuse and said ground connection, and with its gate coupled to an addressing signal.

14. The antifuse programming and detecting circuit of claim 13, wherein said programming circuit further comprises a second transistor with a gate coupled to said addressing signal for controlling said ground connection to said latch circuit.

15. The antifuse programming and detecting circuit of claim 9, wherein said reset circuit comprises a transistor with two terminals coupled between a node of said output signal and a ground connection, and with a gate being coupled to a reset signal.

* * * * *